United States Patent [19]

Hwangbo et al.

[11] Patent Number: 5,285,409
[45] Date of Patent: Feb. 8, 1994

[54] SERIAL INPUT/OUTPUT MEMORY WITH A HIGH SPEED TEST DEVICE

[75] Inventors: Jun-sik Hwangbo, Seoul; Jae-Yeong Do, Kyounggi, both of Rep. of Korea

[73] Assignee: SamSung Electronics Co., Ltd., Kyungki, Rep. of Korea

[21] Appl. No.: 871,733

[22] Filed: Apr. 21, 1992

[30] Foreign Application Priority Data

Oct. 30, 1991 [KR] Rep. of Korea ............... 19191-1991

[51] Int. Cl.[5] .................... G11C 7/00; G11C 8/00
[52] U.S. Cl. .................. 365/189.12; 365/221; 365/236; 365/240
[58] Field of Search ............... 365/221, 236, 240, 201, 365/189.12

[56] References Cited

U.S. PATENT DOCUMENTS 4,873,671 10/1989 Kowshik et al. ............ 365/189.12
5,051,995 9/1991 Tobita ........................ 365/201

Primary Examiner—Eugene R. LaRoche
Assistant Examiner—Son Dinh
Attorney, Agent, or Firm—Robert E. Bushnell

[57] ABSTRACT

A device for changing a frequency of an internal control clock for testing a chip, by incorporating a mode selection circuit (30) and a high voltage detection circuit (40) in a serial input/output memory. The mode selection circuit (30) is connected between two selected adjacent circuits $C_{n-2}$, $C_{n-1}$ among a plurality of frequency conversion circuits $C_1 \ldots C_n$, for accessing selectively either a clock pulse $CP_{n-2}$ from the frequency conversion circuit $C_{n-2}$, arranged in front thereof or a system clock XSK, in dependence upon an internal voltage sense signal IV, IVB. The high voltage detection circuit (40) transmits the internal voltage sense signal to the mode selection circuit (30) by detecting a level of externally applied voltage XV. The internal control clock ICK provided by this device attains a period of $T_{XSK} \times 2^{n-M+1}$, wherein "M" is a number of the counter receiving the mode selection signals MS, MSB next to the mode selection circuit.

25 Claims, 6 Drawing Sheets

SERIAL INPUT/OUTPUT MEMORY WITH A HIGH SPEED TEST DEVICE

BACKGROUND OF THE INVENTION

This invention relates to a serial input/output memory, and more particularly, to a device for increasing transmission speed of test bits in a test operation in the serial input/output memory using a serial clock applied from an exterior source as an internal clock, by converting a frequency of the serial clock.

Generally, it is well known that a serial transmission method is useful in transmission between a system such as a central processing unit for processing data in parallel and a system such as an auxiliary unit for processing data in series. A transmitter sends each bit of the data separately and a receiver assembles the bits in order to reconstruct the data upon reception. For example, the receiver completes a word after receiving eight bits sequentially, in the case where one word comprises eight bits.

An universal asynchronous receiver and transmitter (hereinafter referred to as "UART") is widely used as such an interface device. A transmission method using the UART is called an UART protocol method.

In the UART protocol method, input data is transmitted to a memory core through a plurality of shift registers; and likewise output data is transmitted through a plurality of shift registers to an external side of an accessed memory, to be received as data bits in serial format (hereinafter referred to as a "serial block memory"). Such shift registers for transmitting data are controlled by an internal clock at various frequencies based on a serial clock (called a "system clock $_{XSK}$").

In conventional serial input and output memory devices, test time is delayed unnecessarily because the internal control clock (which has a frequency that is 1/512 times the system clock) is passed through nine counters prior to use in testing character and access functions of a chip.

SUMMARY OF THE INVENTION

It is one object of the current invention to provide an improved serial input/output memory device.

It is another object to provide a circuit for reducing the testing time of a chip in a serial input/output memory.

It is still another object to provide a circuit enabling selective access to either a clock pulse generated by a frequency conversion circuit, and a system clock signal.

It is yet another object to provide a circuit enabling access to selected ones of a plurality of related frequencies, based on a single system clock frequency.

In accordance with the present invention, a serial input/output memory comprises a plurality of serially connected frequency conversion circuits using a system clock of a given frequency to generate an internal control clock signal, a mode selection circuit and a high voltage detection circuit. The mode selection circuit is connected between two adjacent frequency conversion circuits among the plurality of frequency conversion circuits, for selectively accessing either a clock pulse from the frequency conversion circuit arranged in front thereof or the system clock signal, in dependence upon an internal voltage sense signal. The high voltage detection circuit is employed to transmit the internal voltage sense signal to the mode selection circuit by detecting a level of an externally applied voltage.

The novel features are believed to have the characteristic of reducing the time required for testing a chip in a serial input/output memory as set forth in the appended claims.

BRIEF DESCRIPTION OF DRAWINGS

The invention itself, as well as other features and advantages thereof, will best be understood by reference to the following detailed description of a particular embodiment, read in connection with the accompanying drawings, wherein.

DETAILED DESCRIPTION OF THE PREFERRED EMBODIMENT

Figure 1:
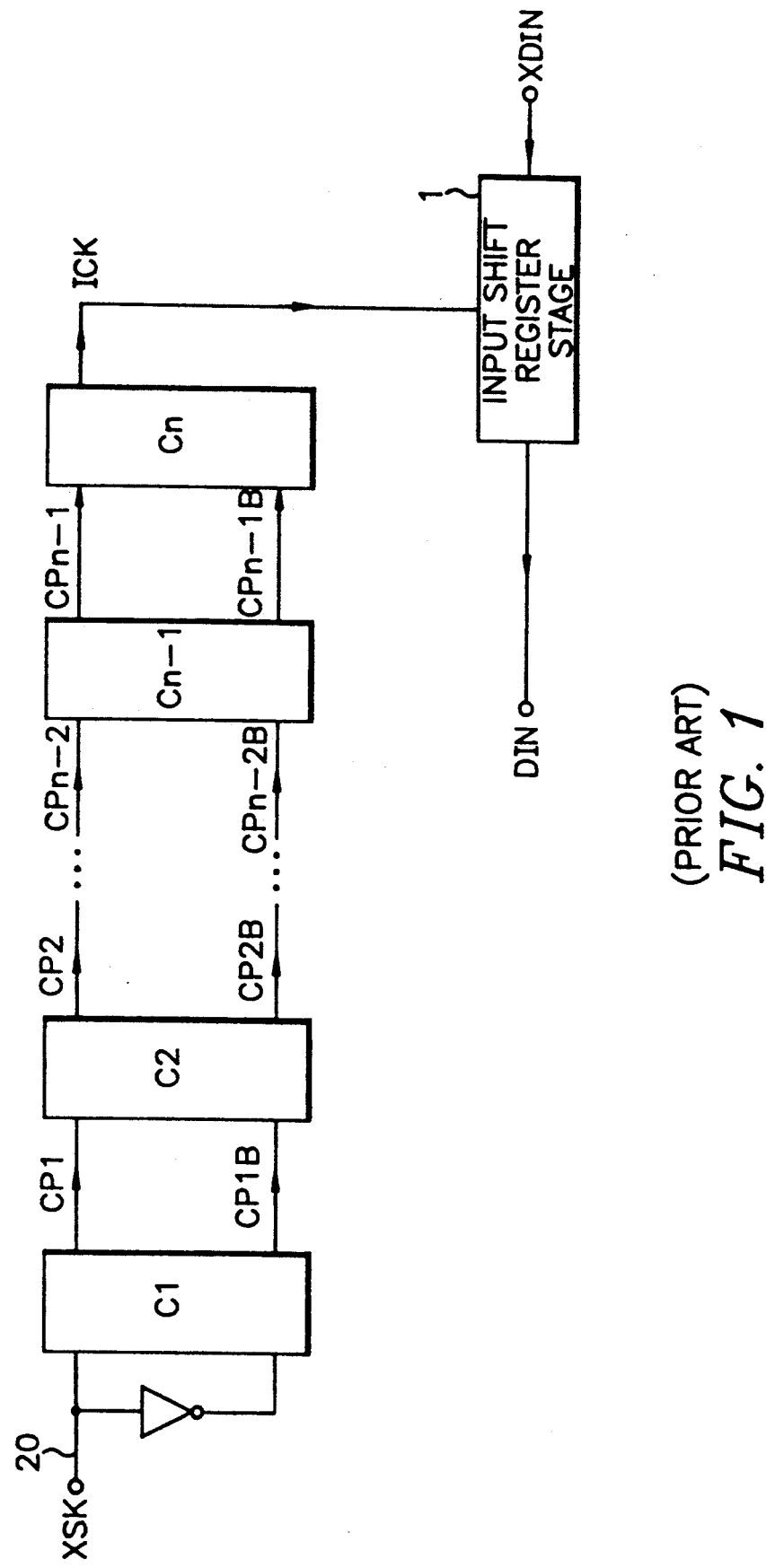
FIG. 1 is a block diagram showing a conventional configuration of a device for data input.
Figure 2:
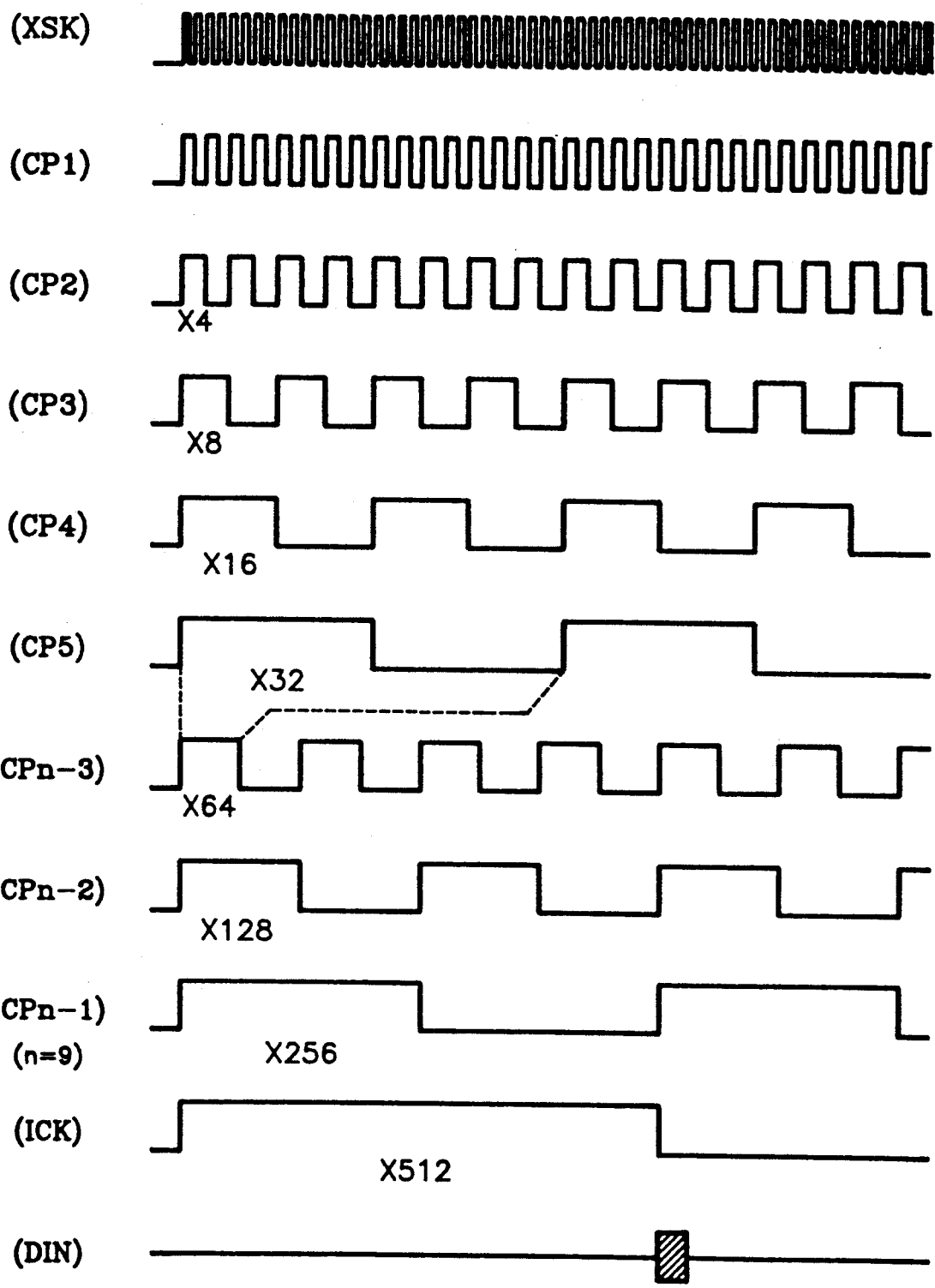
FIG. 2 is a graph showing timing of test performance according to the conventional configuration as shown in FIG. 1.

Referring now to the FIGS. 1 and 2, a description on how to access a received data bit in a conventional serial input and output memory such as via a shift register stage 1 is given.

The system clock XSK received from an external side is transformed through a frequency dividing circuit using a given number "n" of counters $C_1 \ldots C_n$ to the internal control clock ICK. For example, nine counters are required for configuring the frequency dividing circuit so as to communicate at 9600 bps (bits per second) while using a system clock of 4.9152 megaHertz. The number nine is a value of "n" in the equation $1/9600 = 2^n \div (4.9152 \text{ megaHertz})$ It takes $1/9600 = 0.104$ milliseconds to transmit one bit, because 9600 bits are transmitted per second. It takes 1.04 milliseconds to transmit a ten bit word comprising eight data bits, one extra stop bit and one extra parity bit. Accordingly, it takes 0.42598 seconds to read data comprising 4096 (512 words × 8 bits per word) bits. The internal control clock ICK obtained from the ninth counter represented in FIGS. 1 and 2 has a frequency $f_{XSK}$ of 1/512 or ($\frac{1}{2}^9$) times that of the system clock XSK, and one data bit is accessed in a trailing edge of the internal control clock at an input shift register stage 1.

In the above conventional device of FIG. 1, there is a problem that a test time is delayed unnecessarily because the internal control clock used in testing character and access functions of a chip (which has a frequency $f_{ICK}$ that is 1/512 times the frequency $f_{XSK}$ of the system clock XSK) is obtained by passing the system clock XSK through the nine counters $C_1 \ldots C_n$.

Figure 3:
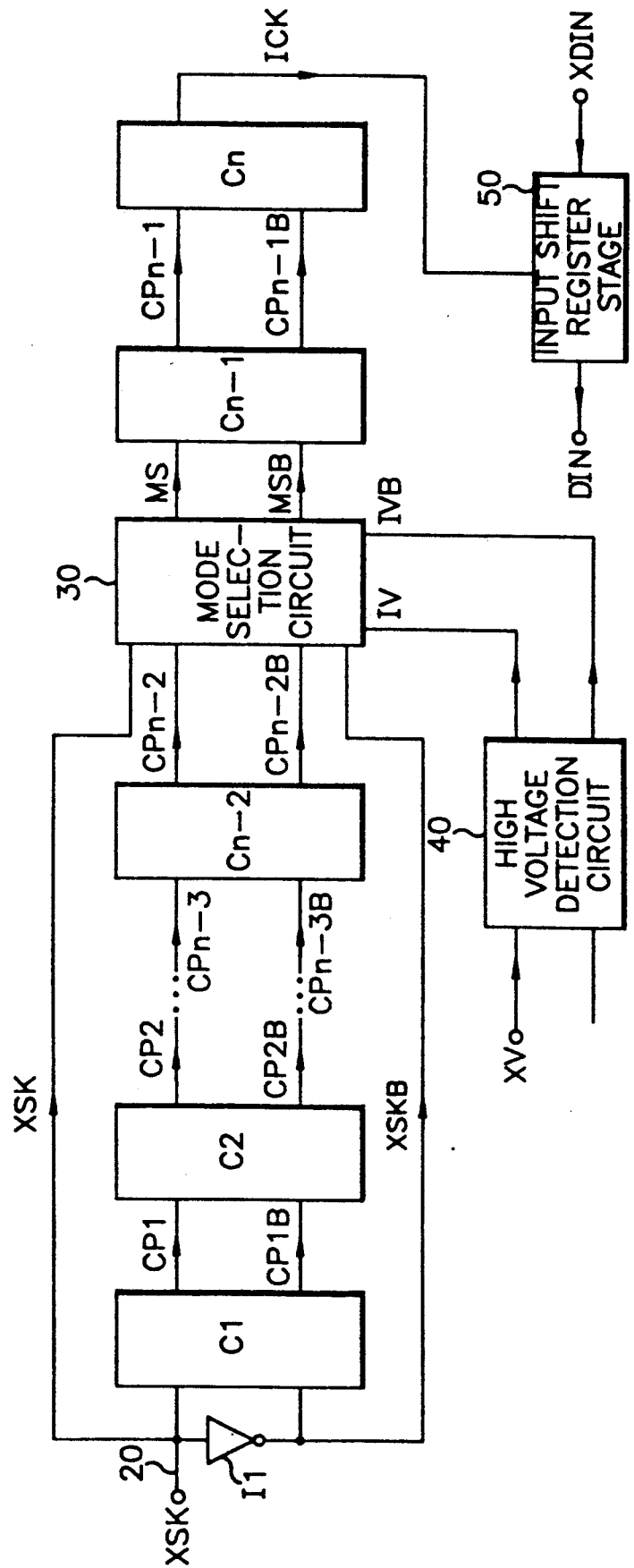
FIG. 3 is a block diagram showing a configuration of a device constructed according to the principles of the present invention.

Referring now to FIG. 3, a high speed test device has a mode selection circuit 30 connected between the counters $C_{n-2}$ and $C_{n-1}$ among "n" counters $C_1 \ldots C_n$ each connected in series. The mode selection circuit 30 divides the frequency $f_{xsk}$ of a system clock XSK applied thereto from an external source (not shown). A high voltage detection circuit 40 connected to the mode selection circuit 30, supplies an internal sensing voltage IV, IVB (B indicates an inverted signal) to the mode selection circuit 30.

The mode selection circuit receives clock pulses $CP_{n-2}$, $CP_{n-2B}$ from a preceding counter $C_{n-2}$ and system clock signals XSK, XSKB directly from input terminal 20. Mode selection signals MS, MSB are transmitted from the mode selection circuit 30 to the next counter $C_{n-1}$.

Figure 4A:
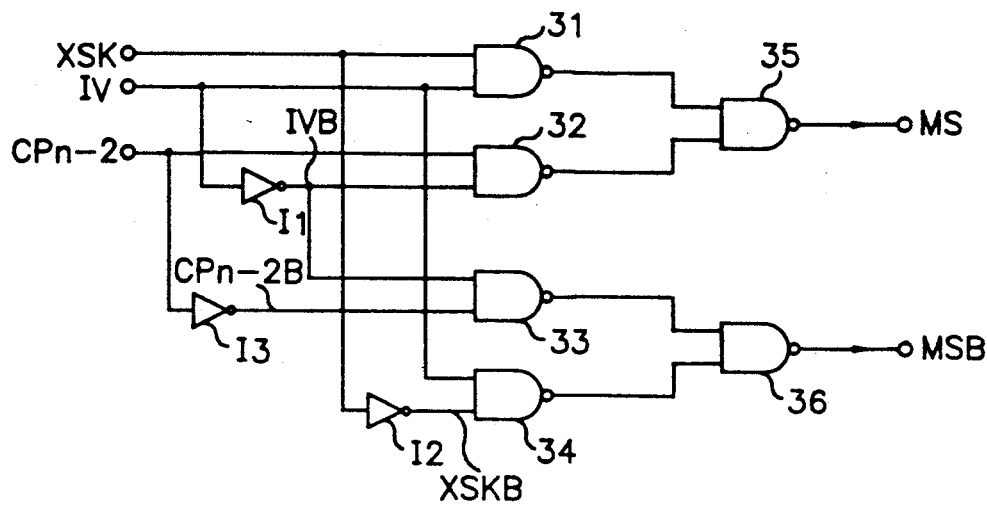
FIG. 4A is a schematic of the mode selection circuit of FIG. 3.

A desirable configuration of the mode selection circuit 30 is illustrated in FIG. 4A. The signals clock system XSK, XSKB are transmitted to NAND gate 31 and, via inverter $I_2$ to NAND gate 34 respectively. The internal sensing voltage IV, IVB is transmitted to NAND gate 31, and NAND gates 32 and 33 respectively, via inverter $I_1$, and the clock pulses $CP_{n-2}$, $CP_{n-2B}$ are transmitted to NAND gate 32, and via inverter $I_3$, to NAND gate 33.

A mode selection signal MS is output by NAND gate 35 in response to outputs from NAND gates 31 and 32, and a complementary mode selection signal MSB is generated by NAND gate 36 in response to outputs from NAND gates 33, 34.

The mode selection circuit 30 is configured so that the mode selection signals MS, MSB correspond to either the system clock XSK, XSKB, or to the clock pulses $CP_{n-2}$, $CP_{n-2B}$ from the preceding counter $C_{n-2}$ based upon the internal sensing voltages IV, IVB. Accordingly, it is noted that a mode selection circuit satisfying the requirements of this invention can also be configured in similar fashion with respect to selected other counters.

Figures 4B, 4C:
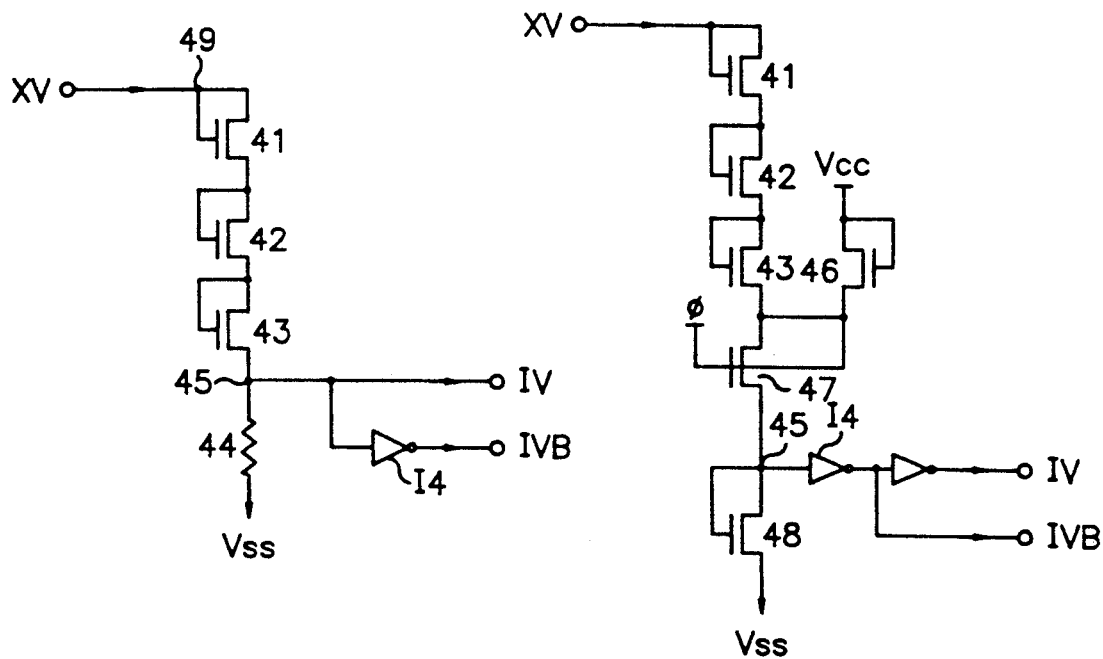
FIG. 4B is a schematic of the high voltage detection circuit of FIG. 3.
FIG. 4C is a schematic of an alternative embodiment of the high voltage detection circuit of FIG. 3.

Desirable alternative embodiments of the high voltage detection circuit 40 are illustrated in FIGS. 4B and 4C.

In FIG. 4B, the high voltage detection circuit 40 comprises NMOS transistors 41, 42, 43 having electrodes connected in source follower type configurations between a terminal 49 for an externally applied voltage source XV and a sensing node 45, and a resistance 44 connected between the sensing node 45 and a terminal for a ground voltage $V_{SS}$.

The internal sensing voltage IV, IVB is derived from the sensing node 45. The internal sensing voltage IV becomes an electric potential of "high" state or "low" state according to the externally applied voltage XV. For example, if an external voltage XV of more than ten volts is supplied, the internal sensing voltage IV has an electric potential, at node 45, of a "high" state owing to the sensing node 45 being connected to the external voltage XV through the NMOS transistors 41, 42, 43. When the external voltage XV has a level of a CMOS operating voltage however, the internal sensing voltage IV has the electric potential of a "low" state owing to the sensing node 45 being connected through the resistance 44 to the ground voltage $V_{SS}$ at terminal 50. Sensing node 45 is coupled to mode sensing circuit 30 via inverter $I_4$.

FIG. 4C shows a high voltage detection circuit with the resistance 44 replaced with a MOS transistor 48. PMOS transistor 47 is connected between a source of the NMOS transistor 43 having gate and drain electrodes coupled in a source follower type configuration and the sensing node 45; a NMOS transistor 46 is connectable to a voltage source $V_{CC}$ so as to maintain an electric potential of $V_{CC}-V_{TH}$ at the source of the NMOS transistor 43, thus resulting in a reduction of electric current consumption and stabilization of an electric potential at the sensing node 45. The PMOS transistor 47 controls a current flow to the sensing node 45 according to a signal $\phi$ applied to a gate of PMOS transistor 47. The circuit of FIG. 4C is more desirable than the circuit of FIG. 4B, because the electric potential of the sensing node 45 is triggered by the inverters as is shown in FIG. 4C.

Figure 5:
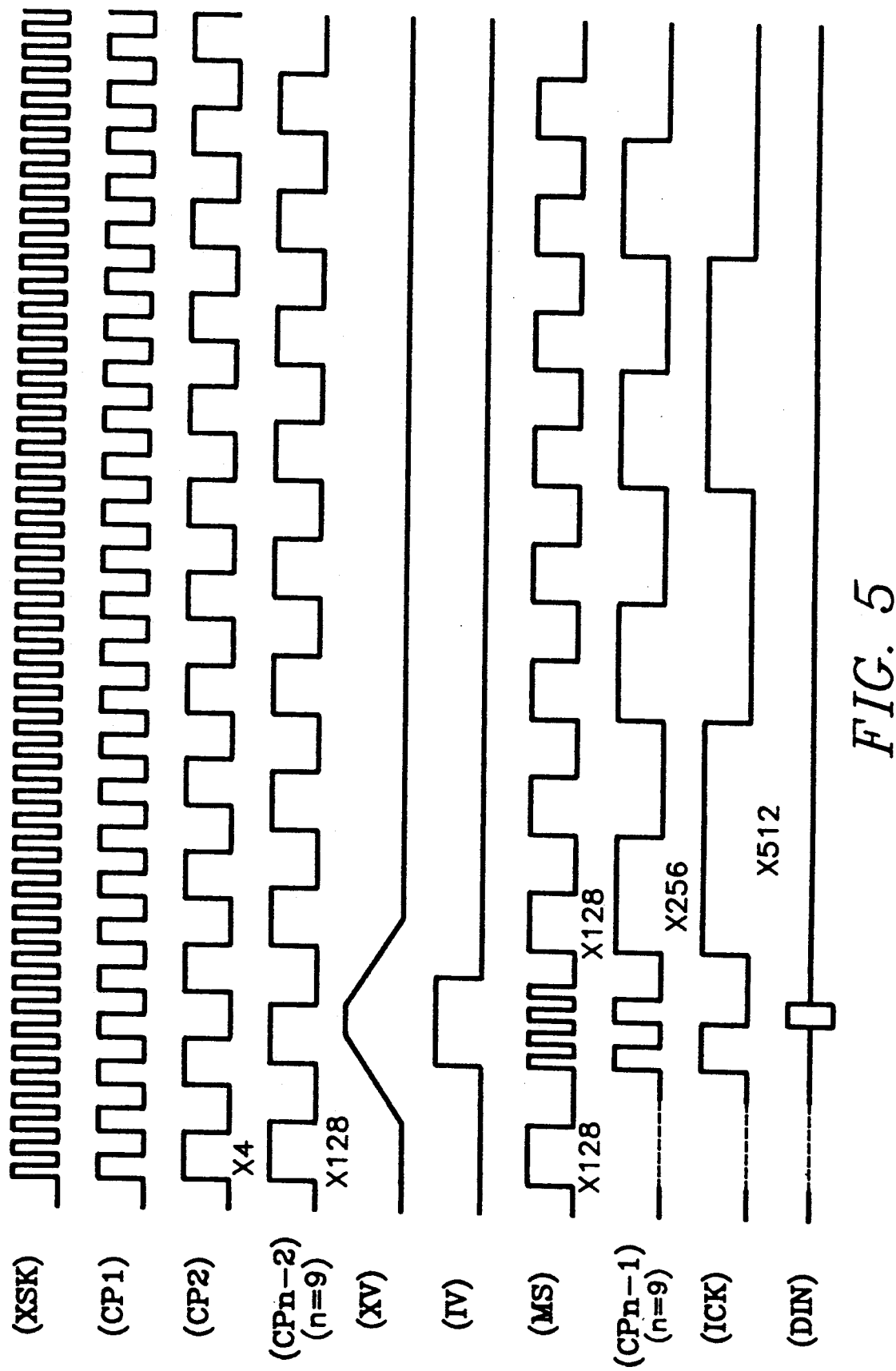
FIG. 5 is a graph of timing data showing test performance of FIG. 3.

FIG. 5 more specifically describes operation of the present invention. When the external voltage XV is more than ten volts, the electric potential of the sensing node 45 of the high voltage detection circuit 40 is raised so as to place the internal sensing voltage IV in a logic "high" state. Accordingly, the NAND gates 32, 33 of the mode selection circuit 30 are disabled (output logic states of NAND gates 32, 33 are fixed in a logic "high" state) so as to prevent transmission of clock pulses $CP_{n-2}$, $CP_{n-2B}$ of the counter $C_{n-2}$. Therefore, an output signal responding to the system clock XSK is generated from the NAND gates 31, 34, 35 and 36. Conversely, when the electric potential of node 45 is in logic low state, NAND gate 31, 34 are disabled, thereby enabling NAND gates 35, 36 to transmit counter clock pulses $CP_{n-2}$ and $CP_{n-2B}$ received via NAND gates 32, 33.

These output signals which are the mode selection signals MS, MSB, are applied to the next counter $C_{n-1}$. The frequency of the mode selection signals MS, MSB are reduced to 1/128 of the conventional clock pulse frequency of 4/9152 megaHertz, assuming that the mode selection circuit is placed between the 7th and 8th counters, because the mode selection signal MS has the same frequency as the system clock XSK of 4.9152 megaHertz at the time, as is shown in FIG. 4A. Thereafter, the mode selection signal having the same frequency as the system clock passes through the next two counters (the 8th and 9th counters), with the result that the frequency of the internal control clock ICK of $f_{ICK}$ is equal to $[4.9152 \times \frac{1}{4}]$ megaHertz results. In other words, the mode selection signals MS, MSB have a frequency of 4.9152 megaHertz, that is, of four times the frequency $f_{ICK}$ of the internal control clock ICK when NAND gates 32, 33 are disabled (i.e., when node 45 is in a "high" logic state). Mode selection signals MS, MSB have a period when NAND gates 32, 33 are disabled, that is 128 times greater than the conventional ICK of period of frequency $4.9152 \times 512$ megaHertz.

In the conventional art, the internal control clock ICK has a frequency of $1/[T_{XSK} \times 2^n]$ (i.e., "$T_{XSK}$" is a period of the system clock and "n" is the number of counters $C_1 \ldots C_n$), while the internal control clock according to the present invention has a period of $T_{XSK} \times 2^{n-M+1}$, wherein "M" is a number of the counter receiving the mode selection signal MS next to the mode selection circuit). If the mode selection circuit 30 is between the 7th and 8th counters, the value of M is 8. The transmission time of the data bit is reduced by the associated amount, that is $T_{XSK} \times (2^n - 2^{n-M+1})$, because the internal control clock ICK with the period of $\frac{1}{2}^{M+1}$ of the conventional access period is used. It may be seen therefore, that circuits constructed according to the foregoing principles enable the test time of chip to be reduced by the rejection of a period of an internal control clock for controlling a data bit transmission.

Figure 6:
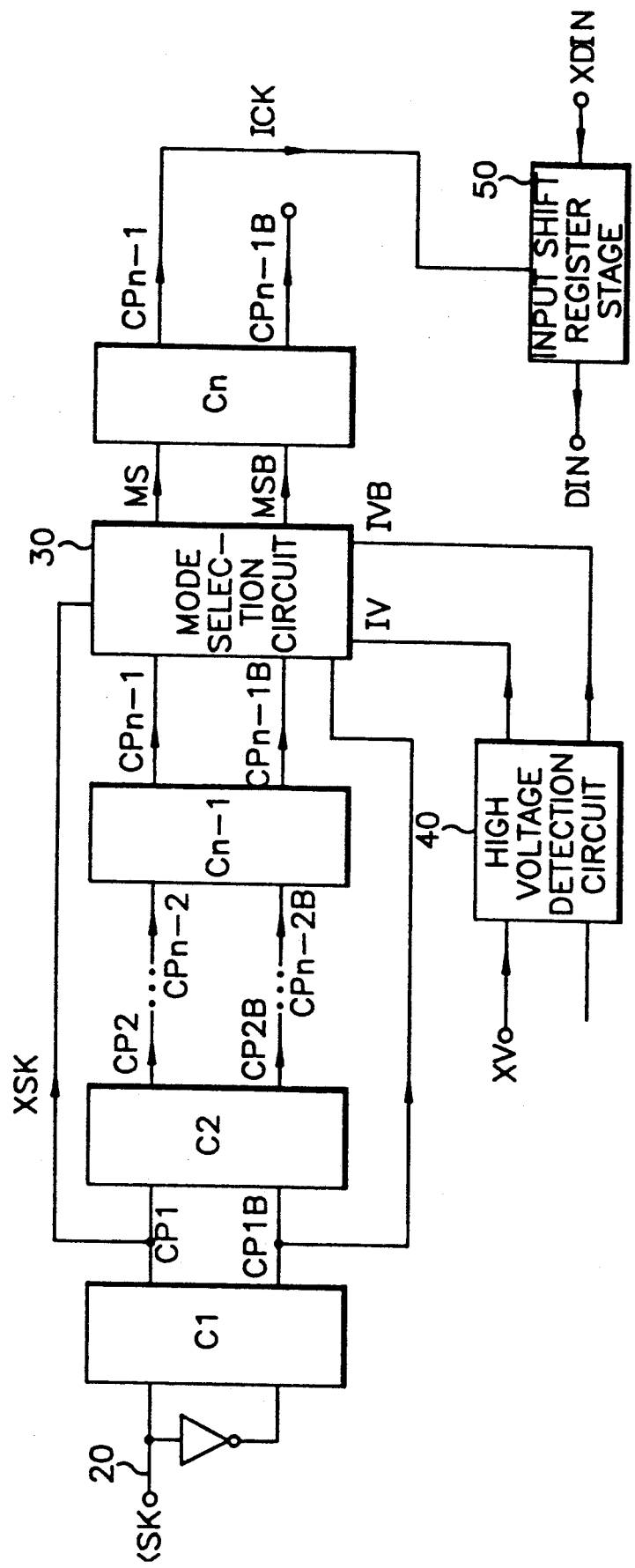
FIG. 6 is a block diagram showing an alternative to the configuration shown in FIG. 3.

In FIG. 6, mode selection circuit 30 may be connected between the counters $C_{n-1}$ and $C_n$ of the serial array of "n" counters $C_1 \ldots C_n$. The mode selection circuit 30 divides the frequency $f_{xsk} \div 2$ of a system clock XSK applied to counter $C_1$ from an external source (not shown). High voltage detection circuit 40 connected to the mode selection circuit 30, supplies an internal sensing voltage IV, IVB. Mode selection circuit 30 receives clock pulses $CP_{n-1}$, $CP_{n-1B}$ from a preceding counter $C_{n-1}$ and clock pulses $CP_1$, $CP_{1B}$ from first counter $C_1$; clock pulses $CP_1$, $CP_{1B}$ have frequencies equal to one half of the frequency $f_{XSK}$ of system clock signals XSK, XSKB. Mode selection signal MS, MSB is transmitted from the mode selection circuit 30 to the next counter $C_n$. Accordingly, circuits constructed according to the foregoing principles illustrated in FIG. 6 also enable the test time of chip to be reduced by the rejection of a period of an internal control clock for controlling a data bit transmission.

Although the invention has been described with reference to the specific embodiment, this description is not meant to be construed in a limiting sense, as other embodiments of the invention will become apparent to person skilled in the art upon reference to the foregoing description of the invention. It is therefore contemplated that the appended claims will cover any such modifications or embodiments as fall within the true scope of the invention.

What is claimed is:

1. A serial input/output memory device including a plurality of serially connected frequency conversion circuits, for generating a sequence of counter clock signals upon reception of system clock pulses of a given frequency to provide internal control clock signals, said memory comprising:
   mode selector means interposed between a preceding one of two adjacent ones of said frequency conversion circuits, for generating mode selection signals having frequencies selected in response to sense signals by selectively enabling transmission of counter clock pulses from said preceding one of said frequency conversion circuits and said system clock pulses to a succeeding one of said two adjacent ones to said frequency conversion circuits; and
   detector means for providing said sense signals to said mode selector means in dependence upon reception of an applied signal.

2. The serial input/output memory device as claimed in claim 1, wherein said mode selector means comprises:
   first gate means for logically combining said system clock pulses and said sense signals to provide a first intermediate signal;
   inverter means for inverting said sense signals, said counter clock pulses and said system clock pulses to respectively provide inverted internal signals, inverted counter clock pulses, and inverted system clock pulses;
   second gate means for logically combining said inverted internal signals and said counter clock pulses to provide a second intermediate signal;
   third gate means for logically combining said inverted internal signals and said inverted counter clock pulses to provide a third intermediate signal;
   fourth gate means for logically combining said sense signals and said inverted system clock pulses to provide a fourth intermediate signal;
   fifth gate means for logically combining said first and second intermediate signals to provide a first of said mode selection signals; and
   sixth gate means for logically combining said third and fourth intermediate signals to provide a second of said mode selection signals having pulses complementary to said first of said mode selection signals.

3. The serial input/output memory device of claim 1, further comprised of said transmission enabling said succeeding one of said frequency conversion circuits to generate said internal control clock signals in dependence upon said mode selection signals.

4. The serial input/output memory device of claim 1, further comprised of said transmission enabling a multiplicity of said plurality of frequency conversion circuits separated from said preceding frequency conversion circuit by said mode selector means, to generate said internal control clock signals in dependence upon said mode selection signals.

5. The serial input/output memory device of claim 1, wherein said mode selector means comprises:
   first logic means coupled to receive said system clock pulses and said sense signals, for generating first intermediate signals while said sense signals exhibit a first logic state; and
   second logic means coupled to receive said counter clock pulses from said preceding frequency conversion circuit and said sense signals, for generating second intermediate signals while said sense signals exhibit a second logic state distinguishable from said first logic state.

6. The serial input/output memory device of claim 5, further comprised of third logic means for transmitting said first intermediate signals in the absence of said second intermediate signals, and for transmitting said second intermediate signals in the absence of said first intermediate signals.

7. The serial input/output memory device of claim 2, further comprised of said transmission enabling a multiplicity of said plurality of frequency conversion circuits separated from said preceding frequency conversion circuit by said mode selector means, to generate said internal control clock signals in dependence upon said mode selection signals.

8. The serial input/output memory device of claim 4, wherein said mode selector means comprises:
   first logic means coupled to receive said system clock pulses and said sense signals, for generating first intermediate signals while said sense signals exhibit a first logic state; and
   second logic means coupled to receive said counter clock pulses from said preceding frequency conversion circuit and said sense signals, for generating second intermediate signals while said sense signals exhibit a second logic state distinguishable from said first logic state.

9. The serial input/output memory device of claim 8, further comprised of third logic means for transmitting said first intermediate signals in the absence of said second intermediate signals, and for transmitting said second intermediate signals in the absence of said first intermediate signals.

10. A serial input/output memory device, comprising:

a plurality of counting means each connected in series, for receiving a system clock signal exhibiting a first frequency, and for providing internal clock signals by generating a sequence of counter clock signals exhibiting different second frequencies related to said first frequency;

detector means for generating sense signals exhibiting logic states depending upon reception of an applied potential;

mode selector means electrically connected between two of said plurality of counting means, for providing mode selection signals by enabling selective transmission of one of said system clock signals and a corresponding one of said counter clock signals exhibiting a frequency different from but related to said first frequency from a first one of said two of said plurality of counting means, to a second one of said two of said counting means, in dependence upon said logic states.

11. The serial input/output memory device of claim 10, further comprised of shift register memory means for transmitting data bits at a frequency determined by a corresponding one of said counter clock signals generated by a final one of said plurality of counting means.

12. The serial input/output memory device of claim 10, wherein said mode selection circuit comprises:

first gate means for logically combining said system clock signals and said sense signals to provide a first intermediate signal;

inverter means for inverting said sense signals, said counter clock signals and said system clock signals to respectively provide an inverted internal signal, an inverted clock pulse, and inverted system clock;

second gate means for logically combining said inverted internal signal and said counter clock signals to provide a second intermediate signal;

third gate means for logically combining said inverted internal signal and said inverted clock pulse to provide a third intermediate signal;

fourth gate means for logically combining said sense signals and said inverted system clock to provide a fourth intermediate signal;

fifth gate means for logically combining said first and second intermediate signals to provide a first of said mode selection signals; and sixth gate means for logically combining said third and fourth intermediate signals to provide a second of said mode selection signals having pulses complementary to said first of said mode selection signals.

13. The serial input/output memory device of claim 10, further comprises of said transmission enabling said second one of said two counting means to generate said internal clock signals in dependence upon said mode selection signals.

14. The serial input/output memory device of claim 10, further comprised of said transmission enabling a multiplicity of said plurality of counting means separated from said preceding frequency conversion circuit by said mode selector means, to generate said internal clock signals in dependence upon said mode selection signals.

15. The serial input/output memory device of claim 10, wherein said mode selector means comprises:

first logic means coupled to receive said system clock signal and said sense signals, for generating a first one of said mode selection signals corresponding to said system clock signal while said sense signals exhibit a first logic state; and second logic means coupled to receive said counter clock signals from said first one of said counting means and said sense signals, for generating a second one of said mode signals corresponding to counter clock signals while said sense signals exhibit a second logic state distinguishable from said first logic state.

16. The serial input/output memory device of claim 15, further comprised of third logic means for transmitting said first one of said mode signals in the absence of said second one of said mode signals, and for transmitting said second one of said mode signals in the absence of said first one of said mode signals.

17. The serial input/output memory device of claim 13, wherein said mode selector means comprises:

first logic means coupled to receive said system clock signal and said sense signals, for generating a first one of said mode selection signals corresponding to said system clock signal while said sense signals exhibit a first logic state; and second logic means coupled to receive said counter clock signals from said first one of said counting means and said sense signals, for generating a second one of said mode signals corresponding to counter clock signals while said sense signals exhibit a second logic state distinguishable from said first logic state.

18. The serial input/output memory device of claim 17, further comprised of third logic means for transmitting said first one of said mode signals in the absence of said second one of said mode signals, and for transmitting said second one of said mode signals in the absence of said first one of said mode signals.

19. The serial input/output memory device of claim 14, wherein said mode selector means comprises:

first logic means coupled to receive said system clock signal and said sense signals, for generating a first one of said mode selection signals corresponding to said system clock signal while said sense signals exhibit a first logic state; and second logic means coupled to receive said counter clock signals from said first one of said counting means and said sense signals, for generating a second one of said mode signals corresponding to counter clock signals while said sense signals exhibit a second logic state distinguishable from said first logic state.

20. The serial input/output memory device of claim 19, further comprised of third logic means for transmitting said first one of said mode signals in the absence of said second one of said mode signals, and for transmitting said second one of said mode signals in the absence of said first one of said mode signals.

21. The serial input/output memory device as claimed in claim 1, wherein said mode selector means comprises:

first gate means for logically combining said system clock pulses and said sense signals to provide a first electrical signal;

inverter means for inverting said sense signals, said counter clock pulses and said system clock pulses to respectively provide inverted internal signals, inverted counter clock pulses, and inverted system clock pulses;

second gate means for logically combining said inverted internal signals and said counter clock pulses to provide a second electrical signal;

third gate means for logically combining said inverted internal signals and said inverted counter clock pulses to provide a third electrical signal;

fourth gate means for logically combining said sense signals and said inverted system clock pulses to provide a fourth electrical signal;

fifth gate means for logically combining said first and second electrical signals to provide a first of said mode selection signals; and sixth gate means for logically combining said third and fourth electrical signals to provide a second of said mode selection signals having pulses complementary to said first of said mode selection signals.

22. The serial input/output memory device of claim 10, wherein said mode selection circuit comprises:

first gate means for logically combining said system clock signals and said sense signals to provide a first electrical signal;

inverter means for inverting said sense signals, said counter clock signals and said system clock signals to respectively provide an inverted internal signal, an inverted clock pulse, and inverted system clock;

second gate means for logically combining said inverted internal signal and said counter clock signals to provide a second electrical signal;

third gate means for logically combining said inverted internal signal and said inverted clock pulse to provide a third electrical signal;

fourth gate means for logically combining said sense signals and said inverted system clock to provide a fourth electrical signal;

fifth gate means for logically combining said first and second electrical signals to provide a first of said mode selection signals; and sixth gate means for logically combining said third and fourth electrical signals to provide a second of said mode selection signals having pulses complementary to said first of said mode selection signals.

23. The serial input/output memory device, comprising:

a plurality of serially connected counting means having a first one of said counting means coupled to receive a system clock signal exhibiting a first frequency, and a last one of said counting means for providing an internal clock signal in dependence upon generation of a sequence of different counter clock signals from each of the preceding counting means to said last one of said counting means, each of said different counter clock signals exhibiting a different frequency from said first frequency of said system clock signal; and mode selector means electrically connected between any two adjacent ones of said plurality of counting means, for providing mode selection signals by enabling selective transmission of one of said system clock signal and a corresponding one of said counter clock signals from a first one of said two adjacent ones of said counting means to a second one of said two adjacent ones of said counting means in dependence upon reception of control signals exhibiting logic states.

24. The serial input/output memory device of claim 23, further comprising:

detector means for generating said control signals exhibiting said logic states in dependence upon application of a voltage potential; and shift register memory means for transmitting data bits at a frequency determined by said internal clock signal.

25. The serial input/output memory device of claim 23, wherein said mode selection means comprises:

first gate means for logically combining said system clock signal and said sense signals to provide a first electrical signal;

inverter means for inverting said sense signals, said corresponding one of said counter clock signals from said first one of said two adjacent ones of said counting means and said system clock signal to respectively provide inverted sense signals, inverted counter clock signals, and an inverted system clock signal;

second gate means for logically combining said inverted sense signals and said corresponding one of said counter clock signals to provide a second electrical signal;

third gate means for logically combining said inverted sense signals and said inverted counter clock signals to provide a third electrical signal;

fourth gate means for logically combining said sense signals and said inverted system clock signals to provide a fourth electrical signal;

fifth gate means for logically combining said first and second electrical signals to provide a first of said mode selection signals exhibiting a first logic state; and sixth gate means for logically combining said third and fourth electrical signals to provide a second of said mode selection signals exhibiting a second logic state complementary to said first logic state.

* * * * *

UNITED STATES PATENT AND TRADEMARK OFFICE
CERTIFICATE OF CORRECTION

PATENT NO. : 5,285,409
DATED : Febuary 8, 1994
INVENTOR(S) : Jun-sik Hwangbo; et al.

It is certified that error appears in the above-indentified patent and that said Letters Patent is hereby corrected as shown below:

Column 2, Line 56, Change "($½^9$)" to --($1/2^9$)-- ;

Column 4, Line 35, Change "4/9152 megaHertz " to --4.9152 megaHertz--.

Signed and Sealed this

First Day of November, 1994

*Attest:*

*Attesting Officer*

BRUCE LEHMAN

*Commissioner of Patents and Trademarks*

UNITED STATES PATENT AND TRADEMARK OFFICE
CERTIFICATE OF CORRECTION

PATENT NO. : 5,285,409  Page 1 of 2
DATED : Febuary 8, 1994
INVENTOR(S) : Jun-sik Hwangbo; et al.

It is certified that error appears in the above-indentified patent and that said Letters Patent is hereby corrected as shown below:

| | | |
|---|---|---|
| Column 5, | Line 57, | Delete "intermediate" ; |
| | Line 65, | Delete "intermediate" ; |
| | Line 68, | Delete "intermediate" ; |
| Column 6, | Line 3, | Delete "intermediate" ; |
| | Line 8, | Delete "intermediate" ; |

UNITED STATES PATENT AND TRADEMARK OFFICE
CERTIFICATE OF CORRECTION

PATENT NO. : 5,285,409   Page 2 of 2
DATED : Febuary 8, 1994
INVENTOR(S) : Jun-sik Hwangbo It is certified that error appears in the above-indentified patent and that said Letters Patent is hereby corrected as shown below:

| | | |
|---|---|---|
| Column 7, | Line 30, | Delete "intermediate" ; |
| | Line 37, | Delete "intermediate" ; |
| | Line 40, | Delete "intermediate" ; |
| | Line 43, | Delete "intermediate" ; |
| | Line 45, | Delete "intermediate" ; |
| | Line 48, | Delete "intermediate" . |

Signed and Sealed this

Tenth Day of June, 1997

Attest:

BRUCE LEHMAN

*Attesting Officer*   *Commissioner of Patents and Trademarks*